(12) United States Patent  
Fischer et al.

(10) Patent No.: US 8,762,914 B2  
(45) Date of Patent: Jun. 24, 2014

(54) METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS

(75) Inventors: Ed Fischer, Salem, OR (US); Michael McSherry, Portland, OR (US); David White, San Jose, CA (US); Bruce Yanagida, Snohomish, WA (US); Akshat Shah, Pittsburgh, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 142 days.

(21) Appl. No.: 12/982,732

(22) Filed: Dec. 30, 2010

(65) Prior Publication Data

US 2012/0023468 A1    Jan. 26, 2012

Related U.S. Application Data

(60) Provisional application No. 61/367,398, filed on Jul. 24, 2010, provisional application No. 61/367,412, filed on Jul. 24, 2010, provisional application No. 61/367,404, filed on Jul. 24, 2010, provisional application No. 61/367,406, filed on Jul. 24, 2010, provisional application No. 61/367,407, filed on Jul. 24, 2010, provisional application No. 61/367,410, filed on Jul. 24, 2010.

(51) Int. Cl.  
*G06F 17/50*    (2006.01)

(52) U.S. Cl.  
USPC ............... 716/112; 715/115; 715/136

(58) Field of Classification Search  
None  
See application file for complete search history.

(56) References Cited

U.S. PATENT DOCUMENTS

| | | | |
|---|---|---|---|
| 4,817,012 A | | 3/1989 | Cali' |
| 5,469,366 A | | 11/1995 | Yang et al. |
| 5,553,002 A | * | 9/1996 | Dangelo et al. ............... 716/102 |
| 5,629,857 A | | 5/1997 | Brennan |
| 5,801,958 A | | 9/1998 | Dangelo et al. |
| 5,872,952 A | | 2/1999 | Tuan et al. |
| 5,999,726 A | | 12/1999 | Ho |
| 6,072,945 A | | 6/2000 | Aji et al. |
| 6,131,182 A | * | 10/2000 | Beakes et al. ................. 716/105 |

(Continued)

OTHER PUBLICATIONS

International Search Report and Written Opinion dated Sep. 16, 2011 for PCT App. No. PCT/US11/45119.

(Continued)

*Primary Examiner* — Leigh Garbowski  
(74) *Attorney, Agent, or Firm* — Vista IP Law Group, LLP

(57) ABSTRACT

Disclosed are methods, systems, and articles of manufacture for constraint verification for implementing electronic circuit designs with electrical awareness. Some embodiments identify or set parasitic constraint(s) and compare the electrical parasitic(s) with corresponding parasitic constraint(s) to determine whether the parasitic constraints are met. Some embodiments first identify, determine, or update the physical data of a component of a partial layout and characterize the electrical parasitics associated with the physical data of the component. Some embodiments identify or determine some schematic level performance constraints and estimate parasitic constraints based on schematic simulation results and the performance constraints; the estimated parasitic constraints are then compared with the corresponding electrical parasitics to determine whether the constraints are satisfied. Some embodiments further map schematic level parasitic constraints to a physical design representation and then compares the mapped parasitic constraints with corresponding electrical constraints to determine whether the mapped constraints are met.

30 Claims, 7 Drawing Sheets

(56) References Cited

U.S. PATENT DOCUMENTS

| | | | |
|---|---|---|---|
| 6,378,110 B1 | 4/2002 | Ho | |
| 6,438,729 B1* | 8/2002 | Ho | 716/113 |
| 6,449,578 B1 | 9/2002 | McBride | |
| 6,470,482 B1* | 10/2002 | Rostoker et al. | 716/102 |
| 6,507,932 B1* | 1/2003 | Landry et al. | 716/103 |
| 6,523,150 B1 | 2/2003 | Buffet et al. | |
| 6,539,533 B1 | 3/2003 | Brown et al. | |
| 6,553,554 B1 | 4/2003 | Dahl et al. | |
| 6,584,606 B1 | 6/2003 | Chiu et al. | |
| 6,643,831 B2* | 11/2003 | Chang et al. | 716/115 |
| 6,643,836 B2 | 11/2003 | Wheeler et al. | |
| 6,665,845 B1 | 12/2003 | Aingaran et al. | |
| 6,701,508 B1 | 3/2004 | Bartz et al. | |
| 6,842,714 B1 | 1/2005 | Acar et al. | |
| 6,877,148 B1 | 4/2005 | Hassibi et al. | |
| 6,910,200 B1 | 6/2005 | Aubel et al. | |
| 6,954,915 B2* | 10/2005 | Batchelor | 716/113 |
| 6,971,074 B2 | 11/2005 | Hasegawa et al. | |
| 6,981,238 B1* | 12/2005 | Churchill | 716/115 |
| 7,016,794 B2 | 3/2006 | Schultz | |
| 7,020,853 B2 | 3/2006 | Skoll et al. | |
| 7,069,526 B2 | 6/2006 | Schubert et al. | |
| 7,076,410 B1 | 7/2006 | Kerzman et al. | |
| 7,089,129 B2 | 8/2006 | Habitz | |
| 7,152,215 B2 | 12/2006 | Smith et al. | |
| 7,155,689 B2* | 12/2006 | Pierrat et al. | 716/52 |
| 7,159,202 B2* | 1/2007 | Lee et al. | 716/103 |
| 7,178,118 B2* | 2/2007 | Ramachandran et al. | 716/112 |
| 7,181,383 B1 | 2/2007 | McGaughy et al. | |
| 7,206,731 B2* | 4/2007 | Sercu et al. | 703/14 |
| 7,228,514 B2* | 6/2007 | Chan et al. | 716/113 |
| 7,243,317 B2* | 7/2007 | Wang et al. | 716/112 |
| 7,251,800 B2* | 7/2007 | McElvain et al. | 716/112 |
| 7,260,562 B2* | 8/2007 | Czajkowski et al. | 706/46 |
| 7,278,120 B2 | 10/2007 | Rahmat et al. | |
| 7,331,029 B2* | 2/2008 | Amit et al. | 716/113 |
| 7,347,621 B2 | 3/2008 | Sri-Jayantha et al. | |
| 7,356,784 B1* | 4/2008 | Dengi et al. | 716/113 |
| 7,383,521 B2 | 6/2008 | Smith et al. | |
| 7,395,519 B2 | 7/2008 | Kawata | |
| 7,552,409 B2* | 6/2009 | Kucukcakar et al. | 716/132 |
| 7,559,045 B2 | 7/2009 | Chen et al. | |
| 7,567,894 B2 | 7/2009 | Durand et al. | |
| 7,574,682 B2 | 8/2009 | Riviere-Cazaux | |
| 7,596,771 B2* | 9/2009 | Cohen et al. | 716/106 |
| 7,640,527 B1 | 12/2009 | Doraira et al. | |
| 7,797,646 B2 | 9/2010 | Chung et al. | |
| 7,802,222 B2 | 9/2010 | Arsintescu | |
| 7,805,698 B1 | 9/2010 | Ferguson et al. | |
| 7,810,063 B1 | 10/2010 | Sharma et al. | |
| 7,818,697 B2 | 10/2010 | Cho | |
| 7,853,915 B2* | 12/2010 | Saxena et al. | 716/129 |
| 7,904,852 B1 | 3/2011 | Cadouri et al. | |
| 7,941,768 B1 | 5/2011 | Wei | |
| 7,966,588 B1 | 6/2011 | Perry et al. | |
| 7,996,812 B2* | 8/2011 | Kotecha et al. | 716/134 |
| 8,091,055 B2* | 1/2012 | Brelsford et al. | 716/111 |
| 8,127,260 B1* | 2/2012 | Song et al. | 716/106 |
| 8,141,013 B2* | 3/2012 | Woods et al. | 716/106 |
| 8,150,638 B1* | 4/2012 | Wu et al. | 702/57 |
| 8,185,856 B2* | 5/2012 | Izuha | 716/114 |
| 8,209,650 B2* | 6/2012 | St. John et al. | 716/111 |
| 8,224,636 B2 | 7/2012 | Kundert | |
| 8,261,228 B1* | 9/2012 | Gopalakrishnan et al. | 716/136 |
| 2002/0166102 A1 | 11/2002 | Du et al. | |
| 2003/0131323 A1 | 7/2003 | McConaghy | |
| 2004/0049747 A1* | 3/2004 | Yamasaki et al. | 716/4 |
| 2004/0078767 A1 | 4/2004 | Burks et al. | |
| 2004/0117748 A1 | 6/2004 | Tester | |
| 2004/0117750 A1 | 6/2004 | Skoll et al. | |
| 2004/0128368 A1 | 7/2004 | Sakai | |
| 2004/0128638 A1 | 7/2004 | Kerzman et al. | |
| 2004/0143809 A1 | 7/2004 | Cowan et al. | |
| 2004/0243949 A1 | 12/2004 | Wang et al. | |
| 2005/0010922 A1 | 1/2005 | Czajkowski et al. | |
| 2005/0114818 A1 | 5/2005 | Khakzadi et al. | |
| 2005/0216873 A1 | 9/2005 | Singh et al. | |
| 2005/0268258 A1 | 12/2005 | Decker | |
| 2005/0268269 A1 | 12/2005 | Coiley | |
| 2005/0273732 A1 | 12/2005 | Xu et al. | |
| 2005/0278665 A1 | 12/2005 | Gentry et al. | |
| 2006/0095884 A1 | 5/2006 | Skoll et al. | |
| 2006/0095889 A1 | 5/2006 | Cote et al. | |
| 2006/0101368 A1 | 5/2006 | Kesarwani et al. | |
| 2006/0123364 A1 | 6/2006 | Cook et al. | |
| 2007/0094622 A1 | 4/2007 | Lee et al. | |
| 2007/0106969 A1 | 5/2007 | Birch et al. | |
| 2007/0118827 A1 | 5/2007 | Rahman | |
| 2007/0234266 A1 | 10/2007 | Chen et al. | |
| 2007/0245274 A1* | 10/2007 | Kimura | 716/4 |
| 2007/0299647 A1 | 12/2007 | Bolcato et al. | |
| 2008/0022251 A1 | 1/2008 | McConaghy et al. | |
| 2008/0133201 A1 | 6/2008 | Guedon | |
| 2008/0148195 A1 | 6/2008 | Chan et al. | |
| 2008/0209365 A1 | 8/2008 | Riviere-Cazaux | |
| 2008/0244497 A1 | 10/2008 | Zhao et al. | |
| 2008/0244498 A1 | 10/2008 | Gupta et al. | |
| 2009/0019411 A1 | 1/2009 | Chandra et al. | |
| 2009/0031261 A1 | 1/2009 | Smith et al. | |
| 2009/0089733 A1 | 4/2009 | Chang et al. | |
| 2009/0144042 A1 | 6/2009 | Lorenz et al. | |
| 2009/0150842 A1 | 6/2009 | Kemerer et al. | |
| 2009/0254874 A1 | 10/2009 | Bose | |
| 2009/0265672 A1 | 10/2009 | St. John et al. | |
| 2010/0023897 A1* | 1/2010 | Pikus | 716/4 |
| 2010/0083200 A1 | 4/2010 | Song et al. | |
| 2010/0217577 A1 | 8/2010 | Korobkov et al. | |
| 2011/0107293 A1 | 5/2011 | Ganzhorn et al. | |
| 2011/0197170 A1* | 8/2011 | Chandramohan et al. | 716/106 |
| 2011/0314437 A1 | 12/2011 | Mcilrath | |
| 2012/0022846 A1 | 1/2012 | White et al. | |
| 2012/0023465 A1 | 1/2012 | Gopalakrishnan et al. | |
| 2012/0023467 A1 | 1/2012 | McSherry et al. | |
| 2012/0117530 A1 | 5/2012 | Green | |

OTHER PUBLICATIONS

International Search Report and Written Opinion dated Sep. 16, 2011 for PCT App. No. PCT/US11/45110.
International Search Report and Written Opinion dated Sep. 22, 2011 for PCT App. No. PCT/US11/45126.
International Search Report and Written Opinion dated Sep. 22, 2011 for PCT App. No. PCT/US11/45123.
International Search Report and Written Opinion dated Dec. 9, 2011 for PCT App. No. PCT/US11/45104.
International Search Report and Written Opinion dated Dec. 7, 2011 for PCT App. No. PCT/US11/45091.
Non-Final Office Action dated Jun. 15, 2012 for U.S. Appl. No. 12/982,822.
Non-Final Office Action dated Jun. 12, 2012 for U.S. Appl. No. 12/982,628.
Non-Final Office Action dated Sep. 14, 2012 for U.S. Appl. No. 13/189,274.
Non-Final Office Action dated Sep. 21, 2012 for U.S. Appl. No. 12/982,721.
Notice of Allowance dated Nov. 14, 2012 for U.S. Appl. No. 12/982,628.
Final Office Action dated Nov. 13, 2012 for U.S. Appl. No. 12/982,822.
Final Office Action dated Apr. 4, 2013 for U.S. Appl. No. 12/982,721.
Notice of Allowance dated Jan. 7, 2013 for U.S. Appl. No. 13/189,274.
Non-Final Office Action dated Jan. 18, 2013 for U.S. Appl. No. 12/982,790.
T. Quarles, "SPICE3 Version 3f3 User's Manual", May 1993.
Final Office Action dated May 2, 2013 for U.S. Appl. No. 12/982,790.
Non-Final Office Action dated Jun. 24, 2013 for U.S. Appl. No. 12/982,762.
Non-Final Office Action dated Aug. 20, 2013 for U.S. Appl. No. 13/189,274.

(56) References Cited

OTHER PUBLICATIONS

Notice of Allowance dated Oct. 21, 2013 for U.S. Appl. No. 12/982,822.
Notice of Allowance dated Oct. 30, 2013 for U.S. Appl. No. 12/982,721.
Notice of Allowance dated Nov. 12, 2013 for U.S. Appl. No. 12/982,790.
Notice of Allowance dated Dec. 4, 2013 for U.S. Appl. No. 13/189,274.
Final Office Action dated Dec. 17, 2013 for U.S. Appl. No. 12/982,762.
Notice of Allowance dated Mar. 6, 2014 for U.S. Appl. No. 12/982,822.

* cited by examiner

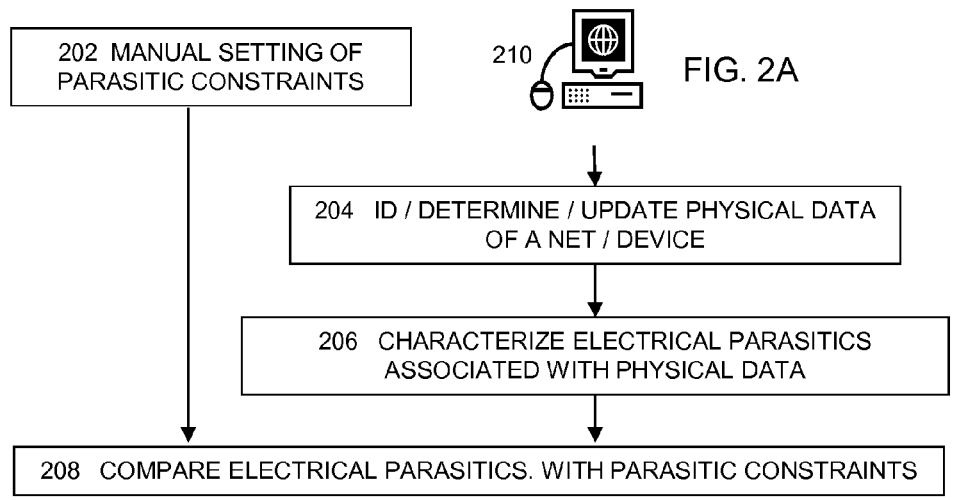
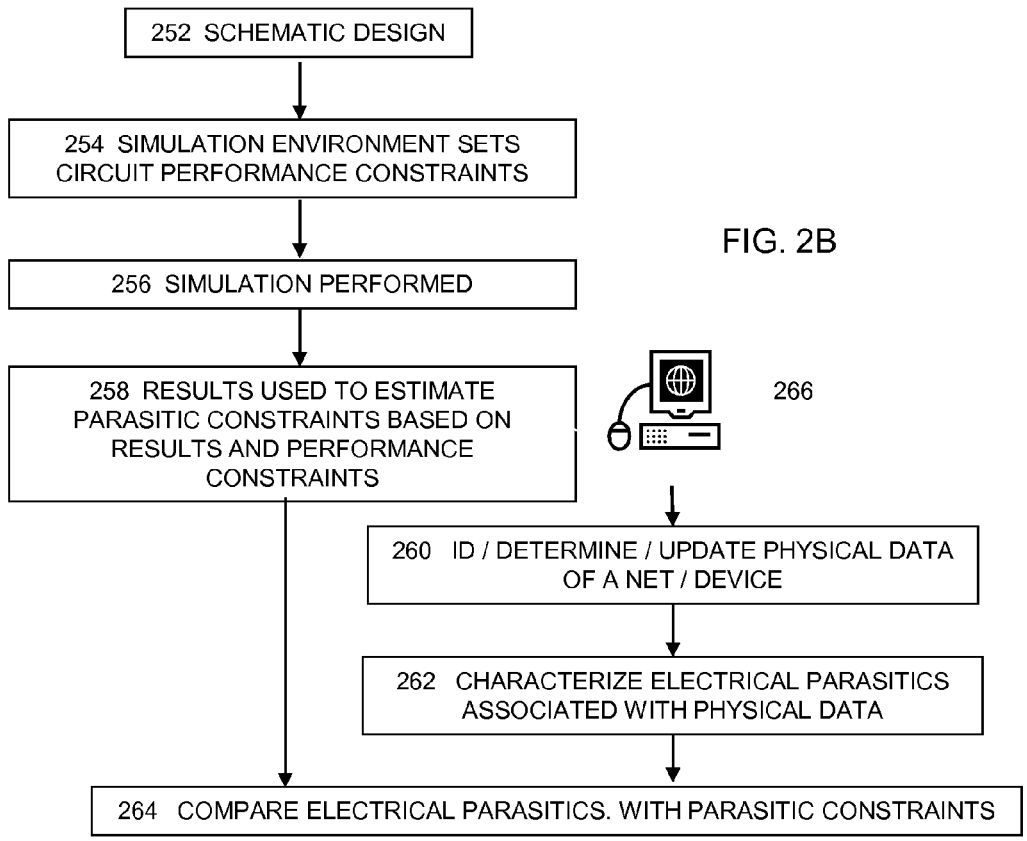

METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS

CROSS-REFERENCE TO RELATED APPLICATIONS

This Application claims the benefit of U.S. Provisional App. Ser. No. 61/367,398, filed on Jul. 24, 2010 and entitled "METHODS, SYSTEMS, AND ARTICLES OF MANUFACTURE FOR CONSTRAINT VERIFICATION FOR IMPLEMENTING ELECTRONIC CIRCUIT DESIGNS WITH ELECTRICAL AWARENESS", U.S. Provisional App. Ser. No. 61/367,412, filed on Jul. 24, 2010 and entitled "METHODS, SYSTEMS, AND ARTICLES OF MANUFACTURE FOR IMPLEMENTING ELECTRONIC CIRCUIT DESIGNS WITH ELECTRICAL AWARENESS", U.S. Provisional App. Ser. No. 61/367,404, filed on Jul. 24, 2010 and entitled "METHODS, SYSTEMS, AND ARTICLES OF MANUFACTURES FOR IMPLEMENTING ELECTRONIC CIRCUIT DESIGNS WITH ELECTRO-MIGRATION AWARENESS", U.S. Provisional App. Ser. No. 61/367,406, filed on Jul. 24, 2010 and entitled "METHODS, SYSTEMS, AND ARTICLES OF MANUFACTURES FOR IMPLEMENTING ELECTRONIC CIRCUIT DESIGNS WITH IR-DROP AWARENESS", U.S. Provisional App. Ser. No. 61/367,407, filed on Jul. 24, 2010 and entitled "METHODS, SYSTEMS, AND ARTICLES OF MANUFACTURES FOR IMPLEMENTING ELECTRONIC CIRCUIT DESIGNS WITH SIMULATION AWARENESS", and U.S. Provisional App. Ser. No. 61/367,410, filed on Jul. 24, 2010 and entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS". The entire contents of the aforementioned applications are hereby expressly incorporated by reference in their entirety.

This Application is related to U.S. patent application Ser. No. 12/982,721, entitled "METHODS, SYSTEMS, AND ARTICLES OF MANUFACTURE FOR IMPLEMENTING ELECTRONIC CIRCUIT DESIGNS WITH ELECTRICAL AWARENESS", U.S. patent application Ser. No. 12/982,762, entitled "METHODS, SYSTEMS, AND ARTICLES OF MANUFACTURE FOR IMPLEMENTING ELECTRONIC CIRCUIT DESIGNS WITH ELECTRO-MIGRATION AWARENESS", U.S. patent application Ser. No. 12/982,790, entitled "METHODS, SYSTEMS, AND ARTICLES OF MANUFACTURES FOR IMPLEMENTING ELECTRONIC CIRCUIT DESIGNS WITH SIMULATION AWARENESS", and U.S. patent application Ser. No. 12/982,628, entitled "METHOD, APPARATUS, AND ARTICLE OF MANUFACTURE FOR PROVIDING IN SITU, CUSTOMIZABLE INFORMATION IN DESIGNING ELECTRONIC CIRCUITS WITH ELECTRICAL AWARENESS". The entire disclosures of the above applications are hereby expressly incorporated by reference in their entireties in the instant Application.

BACKGROUND

The recent advances in very deep sub-micron (VDSM) integrated circuits (ICs) have brought new challenges in the physical design methodology process of integrated systems. For example, most conventional electronic circuit design tools focus on post-layout verification to verify, for example, whether parasitics satisfy the corresponding constraints when the entire chip design is complete and detailed information about the parasitics of the physical designs and the currents drawn by the transistors are known. In these conventional approaches, the parasitics are extracted from the completed layout and then verified against the corresponding constraints. Moreover, the conventional circuit synthesis step is followed by layout synthesis, and each step is carried out independent of the other in these conventional approaches. This is again followed by a physical or formal verification step upon the completion of the entire physical layout to check whether the desired goals have been achieved after layout generation and extraction. These steps are carried out iteratively in the conventional approaches till the desired performance goals are met.

Nonetheless, such an iterative approach wastes significant amount of resources because various physical design tools, such as the placement tool, the router, etc., and various schematic design tools, such as the schematic editor, the schematic level simulator(s), etc., are unaware of the parasitics associated with the physical design of the electronic circuit and the electrical characteristics associated with the parasitics.

Thus, there exists a need for constraint verification for implementing electronic circuit designs with electrical awareness early in the design stage.

SUMMARY

What is needed is a method, a system, and a computer program product for constraint verification for implementing electronic circuit designs with electrical awareness. Some embodiments are directed at performing constraint verification during the implementation of the physical design of an electronic circuit. In one or more embodiments, the method or system for constraint verification for implementing electronic circuit designs with electrical awareness identifies, determines, or updates the physical data of a net, a device, or a component (hereinafter "component" collectively.) In various embodiments, the method or system may characterize shapes associated with a net and need to determine connectivity to identify one net from another. In some embodiments, the method or the system may also comprise the process or module for identifying, determining, or characterizing an electrical parasitic that is associated with the component in the physical design. In some embodiments, the method or the system may also comprise the process or module for identifying, determining, or characterizing a device parameter that is associated with the component in the physical design. In some embodiments, the method or the system may also comprise the process or module for identifying, determining, or characterizing an electrical parasitic or a device parameter that is associated with the component in the physical design. In these embodiments, the electrical parasitic and the device parameter are collectively referred to as "electrical parasitic" or simply "parasitic".

In one or more embodiments, the method or the system may identify or receive one or more constraints corresponding to the one or more parasitics. In these embodiments, the methods or systems may then perform the process(es) to compare the one or more electrical parasitics with the corresponding parasitic constraints. More details about various processes or modules for the methods or systems for constraint verification for implementing electronic circuits with electrical awareness will be further described in the following paragraphs with reference to the respective figures.

In one or more embodiments, the characterization of electrical parasitics, such as but not limited to various types of R, L, or C for one or more shapes that constitute a net, and the subsequent characterization of the electrical behavior or characteristic(s), such as but not limited to various types of currents, voltages, or current densities, as well as the constraint verification occur as a single net (or one or more shapes that are part of a net) has been created or modified but before the creation or modification of the next net or one or more shapes that are part of the next net. These characterizations or verification may also occur incrementally as a net is being created or modified in some embodiments. The simulation produced terminal currents may be used as one or more nets that connect to these terminals are being created or modified in some embodiments. In addition, these characterizations or verification may occur while there is only a partial layout in some embodiments. In these embodiments, the simulation, re-simulation, characterization, or verification of the electronic circuit design may be performed in conjunction with the creation or modification of the physical design of an electronic circuit design so that any impact of a circuit component is addressed before the physical design is completed.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 2A-B illustrate top level block diagrams for a method or system for constraint verification for implementing electronic circuit designs with electrical awareness in some embodiments.

DETAIL DESCRIPTION

Various embodiments of the invention are directed to a methods, systems, and articles of manufacture for implementing electronic circuit designs with electrical awareness in one or more embodiments. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the invention. Where certain elements of the present invention can be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments of the present invention encompasses present and future known equivalents to the components referred to herein by way of illustration.

Figure 1A:
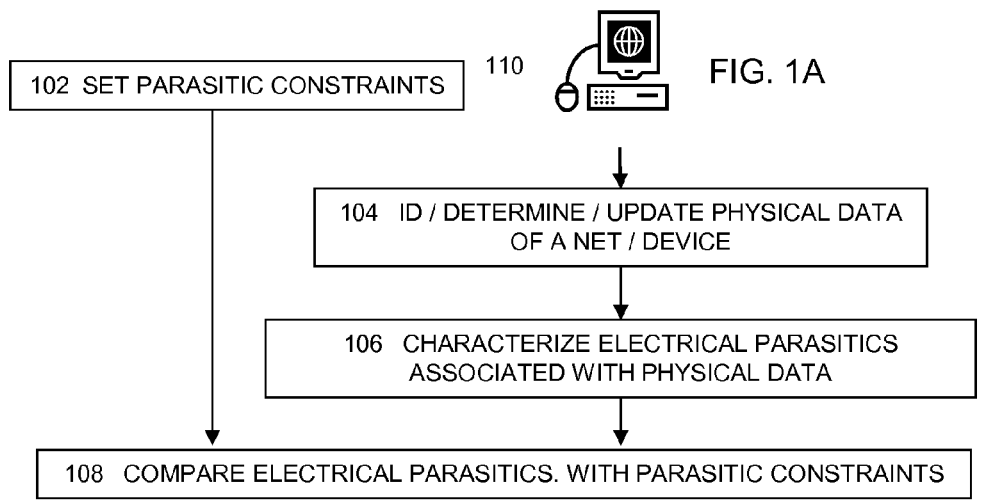
FIGS. 1A-B illustrate top level block diagrams for a method or system for constraint verification for implementing electronic circuit designs with electrical awareness in some embodiments.

FIG. 1A illustrates a top level diagram for a method or system for constraint verification for implementing electronic circuit design with electrical awareness in some embodiments. FIG. 1A illustrates that the system may comprise using an user interface of a computing system 110 to interface with various processes or modules for performing various actions as described below. More details about the user interface are described in U.S. patent application Ser. No. 12/982,628, entitled "METHODS, SYSTEMS, AND ARTICLES OF MANUFACTURE FOR PROVIDING IN SITU, CUSTOMIZABLE INFORMATION FOR IMPLEMENTING ELECTRONIC CIRCUIT DESIGNS WITH ELECTRICAL AWARENESS", the entire disclosure of which are hereby expressly incorporated by reference in their entireties in the instant Application.

In one or more embodiments, the method or the system may comprise the process or module 104 for identifying, determining, or updating the physical data of a net, a device, or a component (hereinafter "component" collectively) of a portion of a physical design of an electronic circuit, for example a portion of a layout of the electronic design. In some embodiments, the method or the system applies to an electronic design when the first component of the design is being implemented in a physical design tool, such as a layout tool. In some embodiments, the process for identifying, determining, or updating physical data of a component of an electronic circuit physical design may be invoked from within a physical design tool or flow, such as a layout editor, while the designer is implementing or modifying the physical design of the electronic circuit rather than from a post-layout verification tool or flow in one or more embodiments. In some embodiments, device recognition and connectivity tasks are performed to able to map electrical characteristics such as current at a given terminal with the proper nets attached to that terminal. In some embodiments, connectivity can be directed to traverse the nets hierarchically and stop on levels determined by the user.

In these embodiments as illustrated in FIG. 1A, the method or the process may also comprise the process or module 106 for characterizing one or more electrical parasitics that are associated with the physical data of the component.

In some embodiments, the characterization of electrical parasitics associated with physical data may be done with a two stage approach. This process begins with the selection a particular net or partial net. In the first stage, the process identifies where along that net that a geometric description should be created. The geometric descriptions may include wire widths and spacings, conductor and ILD (inter layer dielectrics) thicknesses, or thickness of barrier materials. A common description may be created and provided via an API (application programming interface.)

The second stage may include one or more components that may translate, transform, convert, or map (hereinafter "map") the geometric description to an equivalent parasitic value such as a resistance, capacitance or inductance. This translation, transformation, conversion, or mapping (hereinafter "mapping") may be done with mathematical algorithms or models that are often referred to as parasitic extraction. The models may be created through the use of semi-empirical methods that combine models or knowledge of the underlying physics with data provided by various solver(s), simulator(s), or a combination thereof. In some cases, the mapping for capacitance may also be done with a solver.

In some embodiments, the second stage may use parasitic extraction for some nets and a field solver for other nets. In some embodiments, the second stage may use a combination of parasitic extraction for, for example, resistance(s) and a field solver for, for example, capacitance(s) on the same net. In some embodiments, the characterization of electrical parasitics may be performed with extraction tools that map geometric dimensions and patterns to corresponding parasitics such as R, L, and C. In some embodiments, the characterization of electrical parasitics includes the use of field solvers (such as but not limited to one or more EM field solvers) that map geometric dimensions and patterns to capacitance(s).

In a single embodiment or in some embodiments, the electrical parasitic data associated with the physical data is provided to a matrix solver for static or transient analysis. The matrix solver is run to produce voltage and current data for device and interconnect components of the design. In a single embodiment or in some embodiments, the method or system for implementing electronic circuit designs with simulation related constraints or performance expectations comprises a flow where the simulator or solver is invoked after a single net has been created or modified.

More details about the processes or modules 104 and 106 are described in the related applications listed in the section entitled "CROSS-REFERENCE TO RELATED APPLICATIONS" of the instant Application, the contents of those related applications are hereby expressly incorporated by reference in their entireties in the instant Application.

The method or the system may further comprise a process or a module 102 for identifying one or more parasitic constraints that are associated with the one or more electrical parasitics in some embodiments. For example, the method or the system may identify or receive the constraints on the resistance (R), the total, coupling, or capacitance coupled through substrate (collectively C), or inductance (L) of a net between two terminals from various sources, such as a user, a constraint manager that interacts with a constraint library, or from the electronic circuit design tool set that comprises various tools in various domains (e.g., the schematic domain, the physical domain, the post-layout domain, . . . ), etc.

In one or more embodiments, the method or the system may further comprise the process or module 108 of performing constraint verification for the one or more constraints associated with the one or more electrical parasitics. In some embodiments, the process or module 108 may comprise the process or module of comparing the one or more electrical constraints with the respective one or more constraints to determine whether the one or more constraints are satisfied.

In one or more embodiments, the characterization of parasitics such as but not limited to various types of R, L, or C for one or more shapes that constitute a net and the subsequent characterization of the electrical behavior or characteristic(s), such as but not limited to various types of currents, voltages, or current densities, as well as the constraint verification occur as a single net (or one or more shapes that are part of a net) has been created or modified but before the creation or modification of the next net or one or more shapes that are part of the next net. These characterizations or verification may also occur incrementally as a net is being created or modified in some embodiments. The simulation produced terminal currents may be used as one or more nets that connect to these terminals are being created or modified in some embodiments. In addition, these characterizations or verification may occur while there is only a partial layout in some embodiments. In these embodiments, the simulation, re-simulation, characterization, or verification of the electrical parasitics may be performed in conjunction with the creation or modification of the physical design of an electronic circuit design so that any impact of a circuit component is addressed before the physical design is completed.

Figure 1B:
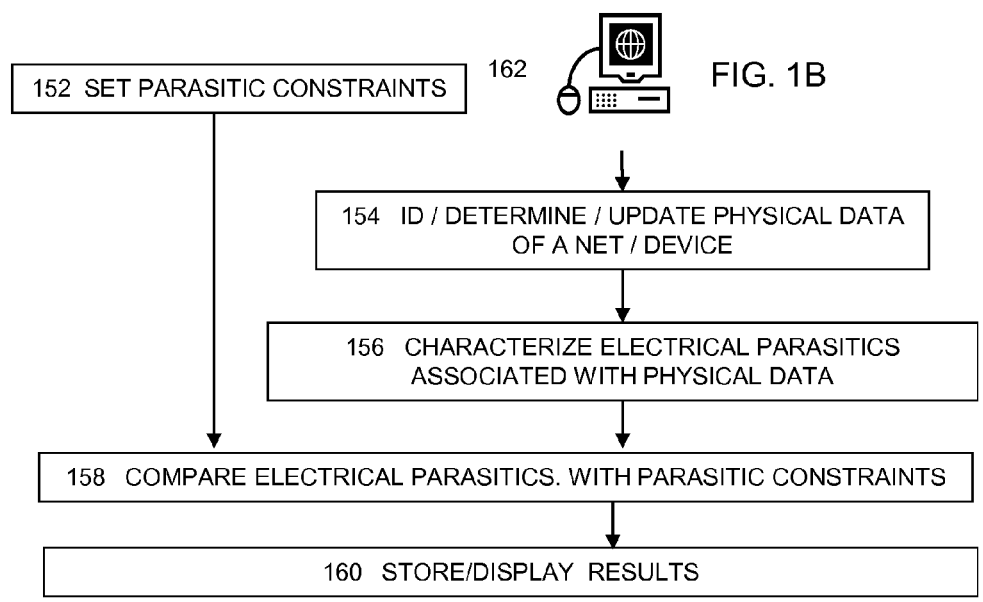

FIG. 1B illustrates a top level block diagram for a method or system for constraint verification for implementing electronic circuit design with electrical awareness in one or more embodiments. The block diagram as illustrated in FIG. 1B is substantially similar to that of FIG. 1A. The method or the system for constraint verification illustrated in FIG. 1B may comprise using an user interface of a computing system 162 to interface with various processes or modules for performing various actions as described below. In one or more embodiments, the method or the system may comprise the process or module 154 for identifying, determining, or updating the physical data of a component of a portion of a physical design of an electronic circuit. In one or more embodiments, the method or the system may comprise the process or module 156 for characterizing one or more electrical parasitics that are associated with the physical data of a component of a portion of a physical design of an electronic circuit.

In these embodiments as illustrated in FIG. 1B, the method or the process may also comprise the process or module 156 for characterizing one or more electrical parasitics that are associated with the physical data of the component. The method or the system may further comprise a process or a module 152 for identifying one or more parasitic constraints that are associated with the one or more electrical parasitics in some embodiments. In one or more embodiments, the method or the system may further comprise the process or module 158 of performing constraint verification for the one or more constraints associated with the one or more electrical parasitics.

In some embodiments, the process or module 158 may comprise the process or module of comparing the one or more electrical constraints with the respective one or more constraints to determine whether the one or more constraints are satisfied. The method or system as illustrated in FIG. 1B may further optionally comprise the process or module 160 for storing one or more results of the process or module in a non-transitory computer readable storage medium or displaying the one or more results in the user interface on a display apparatus in some embodiments.

FIG. 2A illustrates a top level block diagram for a method or system for constraint verification for implementing electronic circuit design with electrical awareness in one or more embodiments. In one or more embodiments, the method or the system for constraint verification for implementing electronic circuit designs comprise using an user interface of a computing system 210 to interface with various processes or modules for performing various actions as described below. In one or more embodiments, the method or the system may comprise the process or module 204 for identifying, determining, or updating the physical data of a component of a portion of a physical design of an electronic circuit, for example a portion of a layout of the electronic design.

In these embodiments as illustrated in FIG. 2A, the method or the process may also comprise the process or module 206 for characterizing one or more electrical parasitics that are associated with the physical data of the component. The method or the system may further comprise a process or a module 202 for identifying or receiving one or more manual settings of parasitic constraints from a user in some embodiments. For example, a designer may manually set the limit on the resistance of an interconnect between two terminals, and the method or the system takes that limit as a constraint and determines whether the electrical parasitic (R in this example) of the interconnect satisfies the constraint that is manually entered by the designer.

In one or more embodiments, the method or the system may further comprise the process or module 208 of performing constraint verification for the one or more constraints associated with the one or more electrical parasitics. In some embodiments, the process or module 208 may comprise the process or module of comparing the one or more electrical constraints with the respective one or more constraints to determine whether the one or more constraints are satisfied.

FIG. 2B illustrates a top level block diagram for a method or system for constraint verification for implementing electronic circuit design with electrical awareness in one or more embodiments. In these embodiments as illustrated in FIG. 2B, the method or the system for constraint verification for implementing electronic circuit designs comprise using an user interface of a computing system 266 to interface with various processes or modules for performing various actions as described below. The method or the system may comprise the process or module 252 for identifying or creating a schematic design of the electronic circuit and/or the process or module 254 for using an environment, for example a simulation environment, for setting, receiving, or identifying one or more circuit performance or behavior constraints in some embodiments.

The method or the system may also comprise the process or module 256 for performing one or more simulations using at least the schematic design and the one or more performance or behavior constraints in some embodiments. The method or the system may further comprise the process or module 258 for estimating one or more parasitic constraints based at least in part upon the result(s) of the one or more simulations and/or the one or more performance or behavior constraints in some embodiments as illustrated in FIG. 2B. For example, the method or the system may use the currents, voltages, etc. determined in the schematic level simulations to estimate the constraints for the corresponding electrical parasitics in some embodiments.

The method or the system may also comprise the process or module 260 for identifying, determining, or updating the physical data of a component of a portion of a physical design of an electronic circuit. The method or the process may also comprise the process or module 262 for characterizing one or more electrical parasitics that are associated with the physical data of the component.

In one or more embodiments after 262 or 256, the method or the system may further comprise the process or module 264 for performing constraint verification for the one or more constraints associated with the one or more electrical parasitics. In some embodiments, the process or module 264 may comprise the process or module of comparing the one or more electrical constraints with the respective one or more constraints to determine whether the one or more constraints are satisfied.

Figure 3:
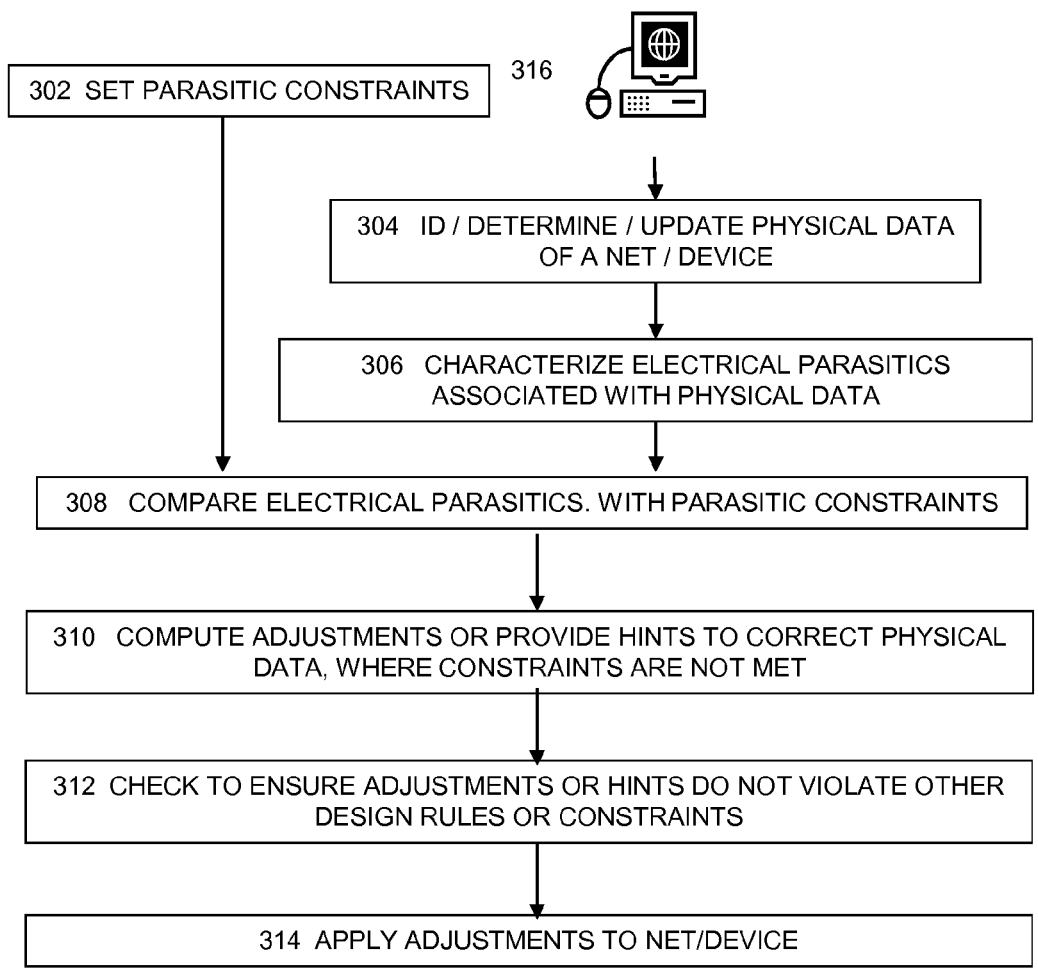
FIG. 3 illustrates more detailed block diagram for the method or system for constraint verification for implementing electronic circuit designs with electrical awareness in some embodiments.

FIG. 3 illustrates more detailed block diagram for the method or system for constraint verification for implementing electronic circuit designs with electrical awareness in some embodiments. In one or more embodiments as illustrated in FIG. 3, the method or the system may comprise the process or module for using an user interface of a computing system 316 to interface with various processes or modules for performing various actions as described below. The method or the system may further comprise the process or module 302 for identifying, setting, or receiving one or more constraints. The method or system may further comprise the process or module 304 for identifying, determining, or updating the physical data of a component of a portion of a physical design of an electronic circuit, for example a portion of a layout of the electronic design. In these embodiments, the method or the system may also comprise the process or module 306 for characterizing one or more electrical parasitics that are associated with the physical data of the component.

Once the one or more parasitics are characterized at 306 and the one or more parasitic constraints are set, identified, or received at 302, the method or the system may further comprise the process or module 308 for verifying whether or not the one or more electrical parasitics meet the corresponding one or more parasitic constraints at 308 in some embodiments. The method or the system may further optionally comprise the process or module 310 for determining or computing one or more adjustments for the physical data in the event that some of the one or more parasitic constraints are not satisfied in some embodiments. In some embodiments, an adjustment comprises creation of a new route or a segment thereof or modification of an existing route or a segment thereof. In some embodiments, an adjustment comprises placement of a component in a physical design of an electronic circuit design.

In addition or in the alternative, the method or the system may further comprise the process or module 310 for providing one or more hints to correct the physical data in the event that some of the one or more parasitic constraints are not satisfied in some embodiments. In addition, the method or the system may also optionally comprise the process or module 312 for determining or checking to see whether the one or more adjustments or the one or more hints violate other design rule(s), constraint(s), or other requirement(s). At 314, the method or the system may comprise the process or module for applying, either automatically or with assistance, at least one of the one or more adjustments to fix the physical data of the component or the physical data of other elements that are also affected by the corresponding one or more electrical parasitics.

Figure 4:
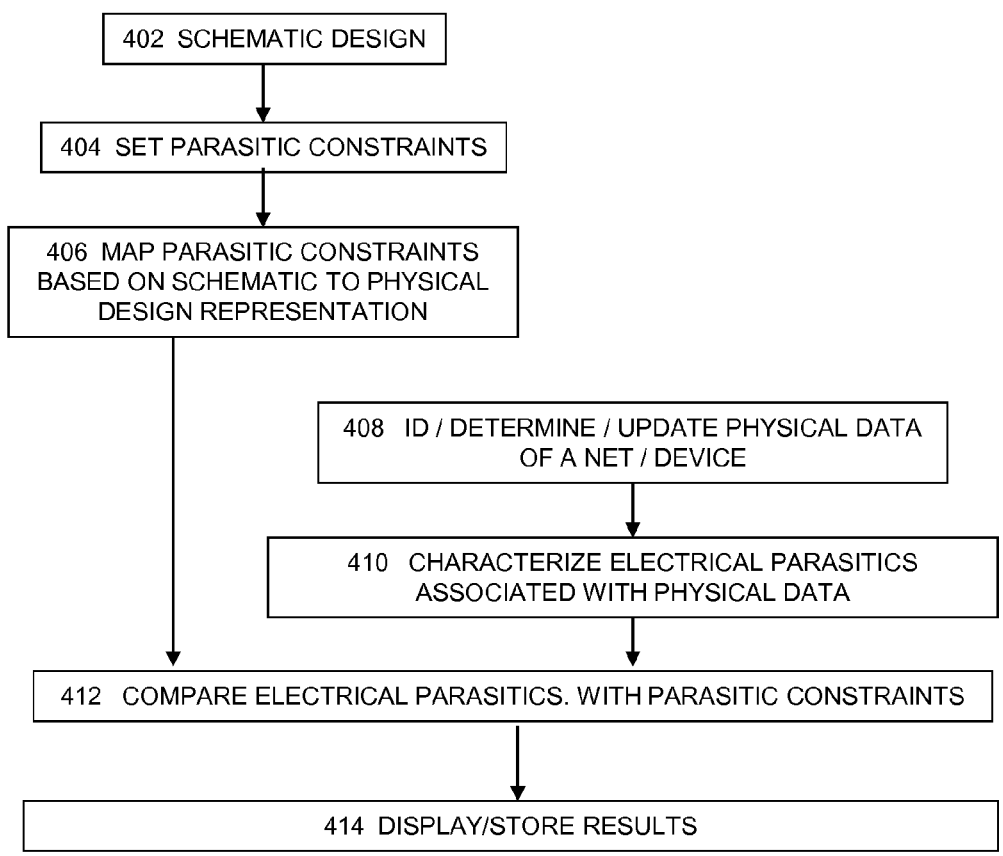
FIG. 4 illustrates more detailed block diagram for the method or system for constraint verification for implementing electronic circuit designs with electrical awareness in some embodiments.

FIG. 4 illustrates more detailed block diagram for the method or system for constraint verification for implementing electronic circuit designs with electrical awareness in one or more embodiments. In some embodiments as illustrated in FIG. 4, the method or the system may comprise the process or module 402 for identifying or creating a schematic design of the electronic circuit and/or the process or module 404 for setting, receiving, or identifying one or more parasitic constraints in some embodiments. The method or the system may further optionally comprise the process or module 406 for mapping the one or more parasitics to a physical design representation in some embodiments.

In addition or in the alternative, the method or the system may comprise the process or module 408 for identifying, determining, or updating the physical data of a component of a portion of a physical design of the electronic circuit in some embodiments. The method or the system may also comprise the process or module 410 for characterizing one or more electrical parasitics that are associated with the physical data in some embodiments.

After the one or more electrical parasitics are characterized at 410 or after the one or more parasitic constraints are mapped at 406, the method or the system may further comprise the process or module 412 for verifying whether the one or more electrical parasitics meet the one or more parasitic constraints in some embodiments. In these embodiments, the method or the system may further optionally comprise the process or module 414 for displaying the results of the act of verifying the parasitic constraints in a user interface on a display apparatus or storing the results on a non-transitory computer readable storage medium in some embodiments.

Figure 5:
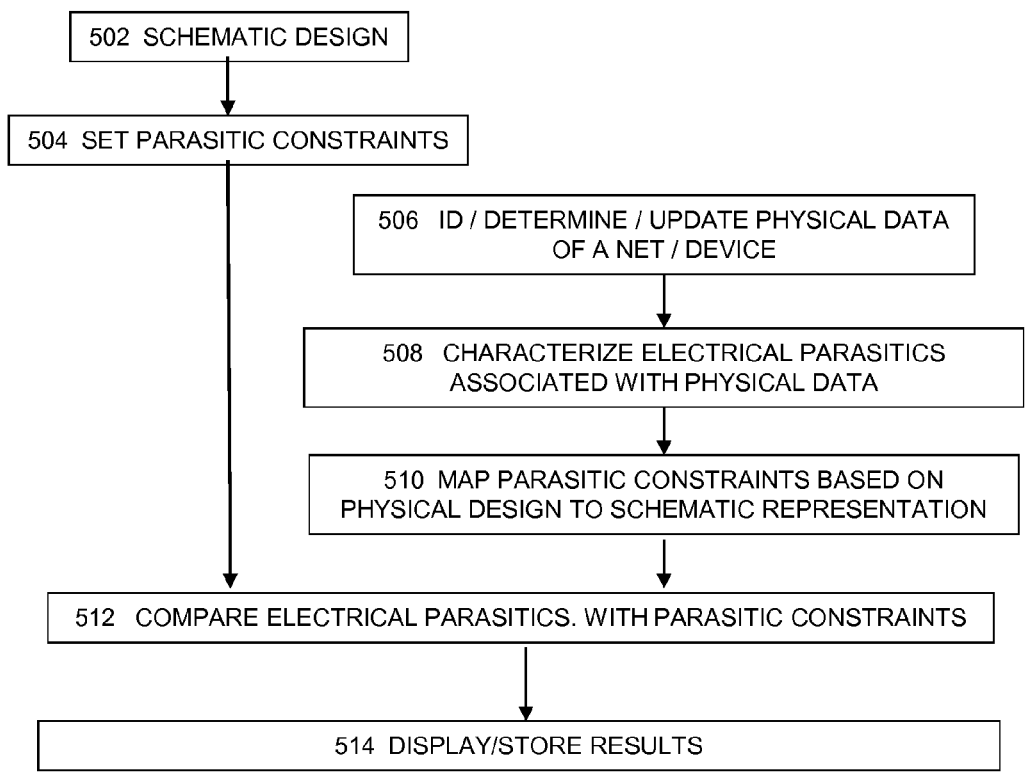
FIG. 5 illustrates more detailed block diagram for the method or system for constraint verification for implementing electronic circuit designs with electrical awareness in some embodiments.

FIG. 5 illustrates more detailed block diagram for the method or system for constraint verification for implementing electronic circuit designs with electrical awareness in one or more embodiments. In these embodiments as illustrated in FIG. 5, the method or the system may comprise the process or module 502 for identifying or creating a schematic design of the electronic circuit and/or the process or module 504 for setting, receiving, or identifying one or more parasitic constraints in some embodiments. In these embodiments as illustrated in FIG. 5, the method or the system may further comprise the process or module 506 for identifying, determining, or updating the physical data of a component in a partial physical design of the electronic circuit. In one or more embodiments, the method or the system may further comprise the process or module 508 for characterizing one or more electrical parasitics that are associated with the physical data of the component in a partial physical design of the electronic circuit.

After the one or more parasitic constraints are mapped at 510 or after the one or more parasitic constraints are set, identified, or received at 504, the method or the system may further comprise the process or module 512 for verifying whether the one or more electrical parasitics meet the corresponding one or more parasitic constraints in some embodiments. In some embodiments, the process or module 512 comprise the process or module of comparing the one or more electrical parasitics with the corresponding one or more parasitic constraints to determine whether the one or more parasitic constraints are met. In these embodiments, the method or the system may further optionally comprise the process or module 514 for displaying the results of the act of verifying the parasitic constraints in a user interface on a display apparatus or storing the results on a non-transitory computer readable storage medium in some embodiments.

Figure 6:
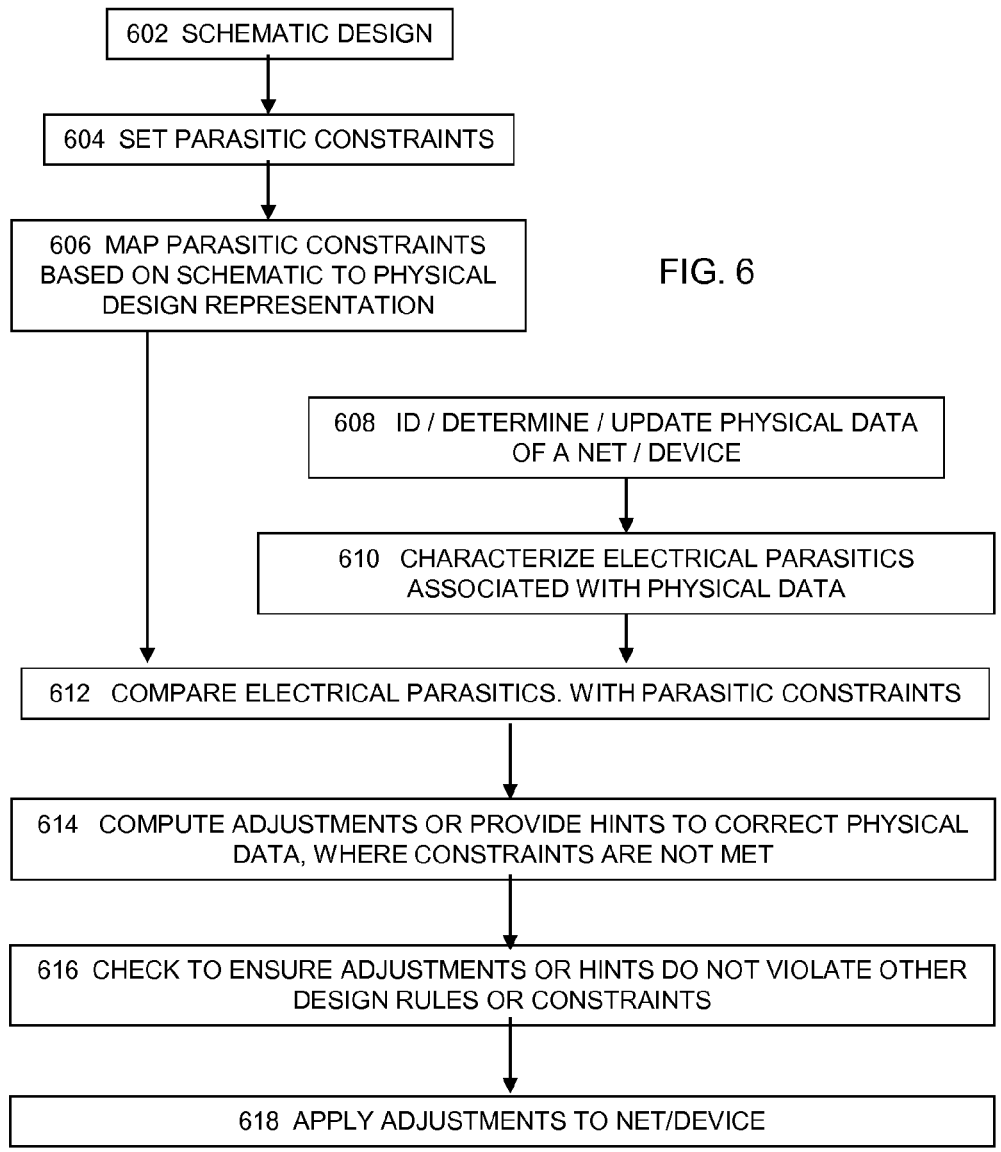
FIG. 6 illustrates more detailed block diagram for the method or system for constraint verification for implementing electronic circuit designs with electrical awareness in some embodiments.

FIG. 6 illustrates more detailed block diagram for the method or system for constraint verification for implementing electronic circuit designs with electrical awareness in one or more embodiments.

The method or system for constraint verification for implementing electronic circuit design with electrical awareness may comprise the process or module of identifying or creating a schematic design at 602 in some embodiments. The method or system for constraint verification for implementing electronic circuit designs with electrical awareness may further comprise the process or module for identifying or receiving a parasitic constraint at 604 in some embodiments. The method or system for constraint verification for implementing electronic circuit designs with electrical awareness may further comprise the process or module for mapping the parasitic constraint at 606 based at least in part upon the schematic-to-physical design representation in some embodiments.

The method or system for constraint verification for implementing electronic circuit designs with electrical awareness may further comprise the process or module for identifying, determining, or updating physical data of a net, a device, or a component of an electronic circuit physical design at 608 in some embodiments. The method or system may also comprise the process or module for 610 characterizing the electrical parasitic associated with the physical data at 660 in some embodiments. After the process or module 610 or the process or module 606, the method or system may also proceed to the process or module for verifying the parasitic constraint at 612 in some embodiments. In some embodiments, the process or module 612 may comprise the process or module 612 for comparing the electrical parasitic with the parasitic constraint to determine whether the parasitic constraint is satisfied.

The method or system may also comprise the process or module for computing one or more adjustments or providing one or more hints to correct the physical data at 614 in some embodiments where the parasitic constraint is not met. The method or system may further comprise the process or module for determining or checking to ensure the one or more adjustments or the one or more hints do not violate other constraints, design rules, or requirements at 616 in some embodiments. The method or system may further comprise the process or module for applying at least one of the one or more adjustments to the component with which the physical data are associated at 618.

System Architecture Overview

Figure 7:
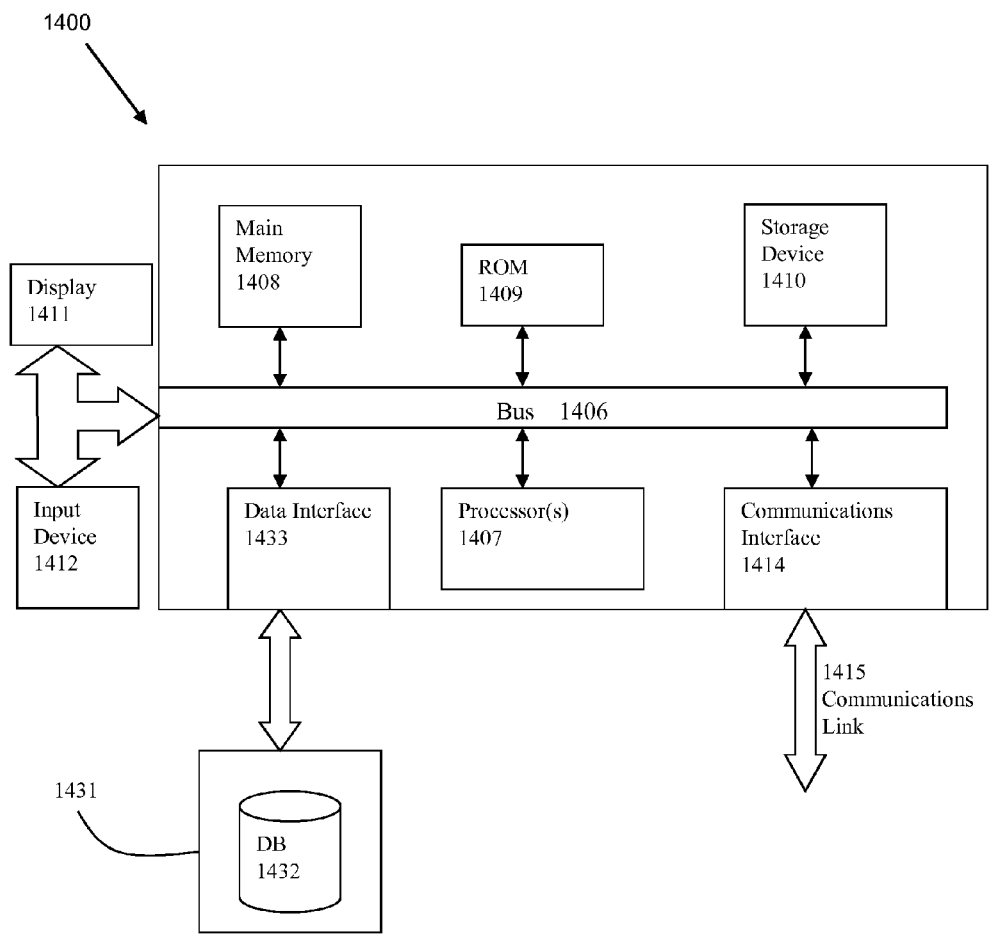
FIG. 7 depicts a computerized system on which a method for timing closure with concurrent process models can be implemented.

FIG. 7 illustrates a block diagram of an illustrative computing system 1400 suitable for implementing some embodiments of the method or system for constraint verification for implementing an electronic circuit design of an electronic circuit with electrical awareness as described in the preceding paragraphs with reference to various figures. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown).

According to one embodiment, computer system 1400 performs specific operations by one or more processors or processor cores 1407 executing one or more sequences of one or more instructions contained in system memory 1408. Such instructions may be read into system memory 1408 from another computer readable/usable storage medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1407, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout shapes or nets are created or modified.

The term "computer readable storage medium" or "computer usable storage medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals that include data streams representing various types of signal information, e.g., instructions, messages and data. In embodiments of the invention, the functions of the data interface 1433 may be performed by the communication interface 1414.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for constraint verification for implementing an electronic circuit design of an electronic circuit with electrical awareness, comprising:
   using at least one processor that is programmed for performing a process that comprises:
      identifying, determining, or updating physical data of a component of a, incomplete physical design of the electronic circuit design;
      determining a parasitic from a schematic level design of the electronic design, rather than from the incomplete physical design, for the incomplete physical design of the electronic circuit design;
      characterizing an electrical parasitic by at least performing incomplete layout extraction on at least some of the physical data of the component in the incomplete physical design; and
      ensuring correctness of the physical data of the component in the incomplete physical design before completion of the electronic design from the incomplete physical design to a complete physical design based at least in part upon the parasitic determined from the schematic level design of the electronic design and the electrical parasitic.

2. The computer implemented method of claim 1, the process further comprising:
   identifying or receiving a parasitic constraint.

3. The computer implemented method of claim 2, wherein the act of ensuring correctness of the physical data comprises:
   determining whether the electrical parasitic meets the parasitic constraint.

4. The computer implemented method of claim 2, the process further comprising:
   identifying or creating a schematic design for the electronic circuit;
   identifying or receiving a first domain constraint; and
   mapping the first domain constraint to a second domain based at least in part on a schematic to physical design representation.

5. The computer implemented method of claim 4, the process further comprising:
   comparing the electrical parasitic that is associated with the physical data with the first domain constraint that is mapped.

6. The computer implemented method of claim 2, the process further comprising:
   identifying another constraint based on the constraint that is identified or received, wherein a satisfaction of the constraint depends on a satisfaction of the another constraint, or the satisfaction of the another constraint depends on the satisfaction of the constraint.

7. The computer implemented method of claim 1, the process further comprising:
   determining an adjustment based at least in part upon a result of the act of ensuring the correctness of the physical data.

8. The computer implemented method of claim 7, the process further comprising:
   determining whether the adjustment violates another constraint.

9. The computer implemented method of claim 7, the process further comprising:

applying the adjustment to the physical data or to other data related to the electrical parasitic or one or more electrical characteristics of the component.

10. The computer implemented method of claim 7, the process further comprising:
   determining whether the adjustment causes one or more violations of one or more design rules or one or more constraints.

11. The computer implemented method of claim 10, the process further comprising:
   displaying a hint based at least in part upon the adjustment to a user.

12. The computer implemented method of claim 11, the hint is generated for application of the adjustment or for fixing the one or more violations.

13. The computer implemented method of claim 1, the process further comprising:
   determining a hint based at least in part upon a result of the act of ensuring the correctness of the physical data; and
   displaying the hint in a user interface on a display apparatus.

14. The computer implemented method of claim 1, the process further comprising:
   providing a user with a capability to manually set up a constraint on the physical data, the electrical parasitic, or the electrical characteristic.

15. The computer implemented method of claim 1, in which the incomplete physical design does not pass a layout versus schematic check or verification.

16. The computer implemented method of claim 1, in which the act of characterizing the electrical parasitic is performed before or at a time of completing creation of a net or modification of an existing net.

17. The computer implemented method of claim 1, the process further comprising:
   verifying an electrical characteristic associated with the component along a net or a partial net after completion of creation or modification of the net or the partial net and before creation or modification of a second net in the incomplete physical design.

18. The computer implemented method of claim 1, in which the act of characterizing the electrical parasitic or the act of characterizing the electrical characteristic is performed based at least in part upon a geometric shape or a set of geometric shapes on a net at a time when the net is created or completed.

19. A system for constraint verification for implementing an electronic circuit design of an electronic circuit with electrical awareness, comprising:
   at least one processor that is at least to:
   identify, determine, or update physical data of a component of a incomplete physical design of the electronic circuit design;
   determine a parasitic from a schematic level design of the electronic design, rather than from the incomplete physical design, for the incomplete physical design of the electronic circuit design;
   characterize an electrical parasitic by at least performing incomplete layout extraction on at least some of the physical data of the component in the incomplete physical design; and
   ensure correctness of the physical data of the component in the incomplete physical design before completion of the electronic design from the incomplete physical design to a complete physical design based at least in part upon the parasitic determined from the schematic level design of the electronic design and the electrical parasitic.

20. The system of claim 19, the at least one processor is further to:
   identify or receive a parasitic constraint;
   identify or create a schematic design for the electronic circuit;
   identify or receive a first domain constraint; and
   map the first domain constraint to a second domain based at least in part on a schematic to physical design representation.

21. The system of claim 19, the at least one processor is further to:
   determine a hint based at least in part upon a result of the act of ensuring the correctness of the physical data;
   determine an adjustment based at least in part upon a result of the act of ensuring the correctness of the physical data;
   determine whether the adjustment violates another constraint; and
   apply the adjustment to the physical data or to other data related to the electrical parasitic or one or more electrical characteristics associated with the component.

22. The system of claim 19, in which the incomplete physical design does not pass a layout versus schematic check or verification.

23. The system of claim 19, in which the at least one processor is to characterize the electrical parasitic before or at a time of completing creation of a net or modification of an existing net to which the component belongs.

24. The system of claim 19, wherein the at least one processor is further to:
   verify an electrical characteristic associated with the component along a net or a partial net after completion of creation or modification of the net or the partial net and before creation or modification of a second net in the incomplete physical design.

25. An article of manufacture comprising a tangible non-transitory computer readable storage medium having a sequence of instructions stored thereupon which, when executed by at least one processor, causes the at least one processor to perform a method for constraint verification for implementing an electronic circuit design of an electronic circuit with electrical awareness, the method comprising:
   using the at least one processor that is programmed or configured for performing a process that comprises:
      identifying, determining, or updating physical data of a component of a incomplete physical design of the electronic circuit design;
      determining a parasitic from a schematic level design of the electronic design, rather than from the incomplete physical design, for the incomplete physical design of the electronic circuit design;
      characterizing an electrical parasitic by at least performing incomplete layout extraction on at least some of the physical data of the component in the incomplete physical design; and
      ensuring correctness of the physical data of the component in the incomplete physical design before completion of the electronic design from the incomplete physical design to a complete physical design based at least in part upon the parasitic determined from the schematic level design of the electronic design and the electrical parasitic.

26. The article of manufacture of claim 25, the process further comprising:
   identifying or receiving a parasitic constraint;
   identifying or creating a schematic design for the electronic circuit;

identifying or receiving a first domain constraint; and mapping the first domain constraint to a second domain based at least in part on a schematic to physical design representation.

27. The article of manufacture of claim 25, the process further comprising:

determining a hint based at least in part upon a result of the act of ensuring the correctness of the physical data;

determining an adjustment based at least in part upon a result of the act of ensuring the correctness of the physical data;

determining whether the adjustment causes one or more violations of another constraint; and applying the adjustment to the physical data or to other data related to the electrical parasitic or one or more electrical characteristics associated with the component.

28. The article of manufacture of claim 25, in which the incomplete physical design does not pass a layout versus schematic check or verification.

29. The article of manufacture of claim 25, in which the act of characterizing the electrical parasitic is performed before or at a time of completing creation of a net or modification of an existing net.

30. The article of manufacture of claim 25, the process further comprising:

verifying an electrical characteristic associated with the component along a net or a partial net after completion of creation or modification of the net or the partial net and before creation or modification of a second net in the incomplete physical design.

\* \* \* \* \*